(12) United States Patent
Suda

(10) Patent No.: US 10,312,168 B2
(45) Date of Patent: Jun. 4, 2019

(54) ELECTRONIC ELEMENT MOUNTING SUBSTRATE, AND ELECTRONIC DEVICE

(71) Applicant: KYOCERA Corporation, Kyoto-shi, Kyoto (JP)

(72) Inventor: Kouki Suda, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 29 days.

(21) Appl. No.: 15/574,442

(22) PCT Filed: Jun. 15, 2016

(86) PCT No.: PCT/JP2016/067738
§ 371 (c)(1),
(2) Date: Nov. 15, 2017

(87) PCT Pub. No.: WO2016/204163
PCT Pub. Date: Dec. 22, 2016

(65) Prior Publication Data
US 2018/0130716 A1 May 10, 2018

(30) Foreign Application Priority Data

Jun. 18, 2015 (JP) ................................. 2015-122934

(51) Int. Cl.
*H01L 23/04* (2006.01)
*H01L 23/02* (2006.01)
(Continued)

(52) U.S. Cl.
CPC ............ *H01L 23/04* (2013.01); *H01L 21/481* (2013.01); *H01L 21/4807* (2013.01);
(Continued)

(58) Field of Classification Search
CPC ... H01L 23/04; H01L 21/481; H01L 21/4857; H01L 21/4867; H01L 27/14618;
(Continued)

(56) References Cited

U.S. PATENT DOCUMENTS 9,872,378 B2 * 1/2018 Kubo ................ H01L 27/14618
2005/0169620 A1 * 8/2005 Minamio .......... H01L 27/14618
396/71

(Continued)

FOREIGN PATENT DOCUMENTS

JP 2002-299592 A 10/2002

*Primary Examiner* — John P. Dulka
(74) *Attorney, Agent, or Firm* — Volpe and Koenig, P.C.

(57) ABSTRACT

An electronic element mounting substrate includes a base body, an electrode, and a pad. The base body has a frame shape, and includes a first frame section and a second frame section, the second frame section being disposed on the first frame section and including an inner surface protruding further inward than an inner surface of the first frame section. The electrode is disposed on a bottom surface of the first frame section of the base body. The pad is disposed on a bottom surface of a protruding part of the second frame section, and is electrically connected to the electrode. A groove extending in a vertical direction is formed in an inner surface of the protruding part of the second frame section of the base body.

13 Claims, 13 Drawing Sheets

(51) Int. Cl.
*H01L 21/48* (2006.01)
*H01L 23/13* (2006.01)
*H01L 27/146* (2006.01)
*H01L 27/148* (2006.01)
*H01L 33/48* (2010.01)
*H01L 33/62* (2010.01)

(52) U.S. Cl.
CPC ...... *H01L 21/4853* (2013.01); *H01L 21/4857* (2013.01); *H01L 21/4867* (2013.01); *H01L 23/02* (2013.01); *H01L 23/13* (2013.01); *H01L 27/14618* (2013.01); *H01L 27/14636* (2013.01); *H01L 27/14806* (2013.01); *H01L 33/483* (2013.01); *H01L 33/62* (2013.01)

(58) Field of Classification Search
CPC ............... H01L 23/13; H01L 21/4853; H01L 27/14636; H01L 27/14806; H01L 21/4807; H01L 23/02; H01L 33/62; H01L 33/483
See application file for complete search history.

(56) References Cited

U.S. PATENT DOCUMENTS

| | | | |
|---|---|---|---|
| 2005/0259174 A1* | 11/2005 | Nishio | H04N 5/2253 348/340 |
| 2008/0237768 A1* | 10/2008 | Yajima | H01L 23/26 257/434 |
| 2010/0193240 A1* | 8/2010 | Takayama | H01L 23/3121 174/521 |
| 2012/0211852 A1* | 8/2012 | Iwafuchi | H01L 27/14618 257/435 |
| 2013/0134538 A1* | 5/2013 | Sato | H01L 31/0232 257/432 |
| 2013/0307000 A1* | 11/2013 | Ikenaga | H01L 33/486 257/91 |
| 2014/0084313 A1* | 3/2014 | Huang | H01L 25/0753 257/88 |
| 2014/0218954 A1* | 8/2014 | Yoon | H01L 33/62 362/546 |
| 2014/0248724 A1* | 9/2014 | Lin | H01L 33/60 438/27 |
| 2015/0177447 A1* | 6/2015 | Woodgate | G02B 6/0046 359/296 |
| 2015/0340570 A1* | 11/2015 | Seo | H01L 33/486 257/99 |
| 2017/0062663 A1* | 3/2017 | Hayashi | H01L 33/62 |
| 2017/0170367 A1* | 6/2017 | Fukuda | H01L 33/486 |
| 2017/0222110 A1* | 8/2017 | Ichihara | H01L 33/62 |
| 2017/0256475 A1* | 9/2017 | Joshi | H01L 23/40 |
| 2018/0182928 A1* | 6/2018 | Namie | H01L 33/62 |
| 2018/0212124 A1* | 7/2018 | Tosuke | H01L 33/62 |
| 2018/0358523 A1* | 12/2018 | Yu | H01L 33/48 |

* cited by examiner

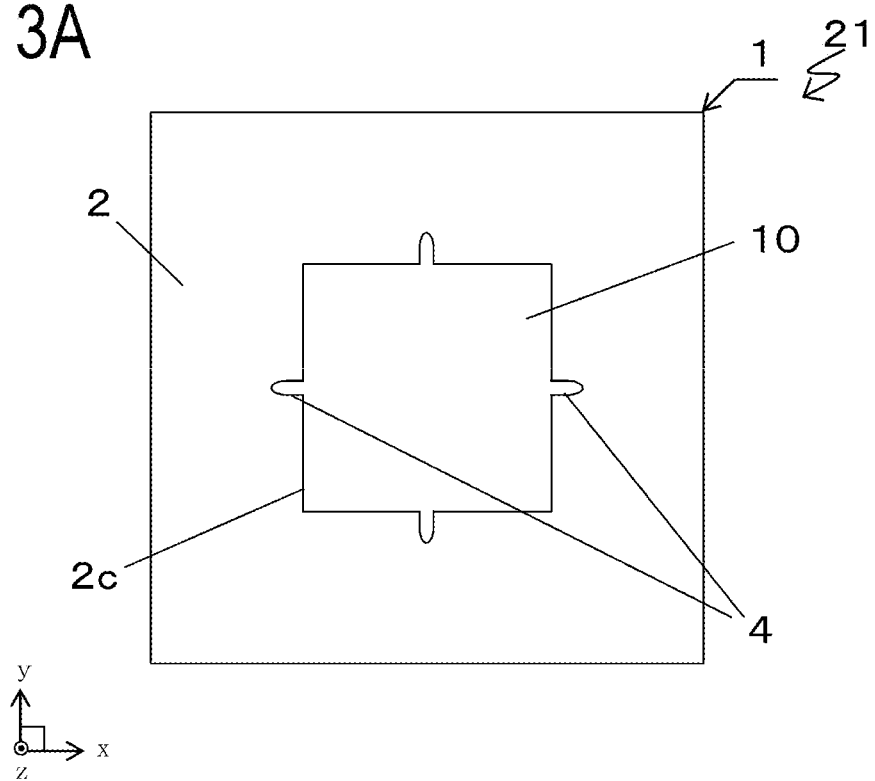
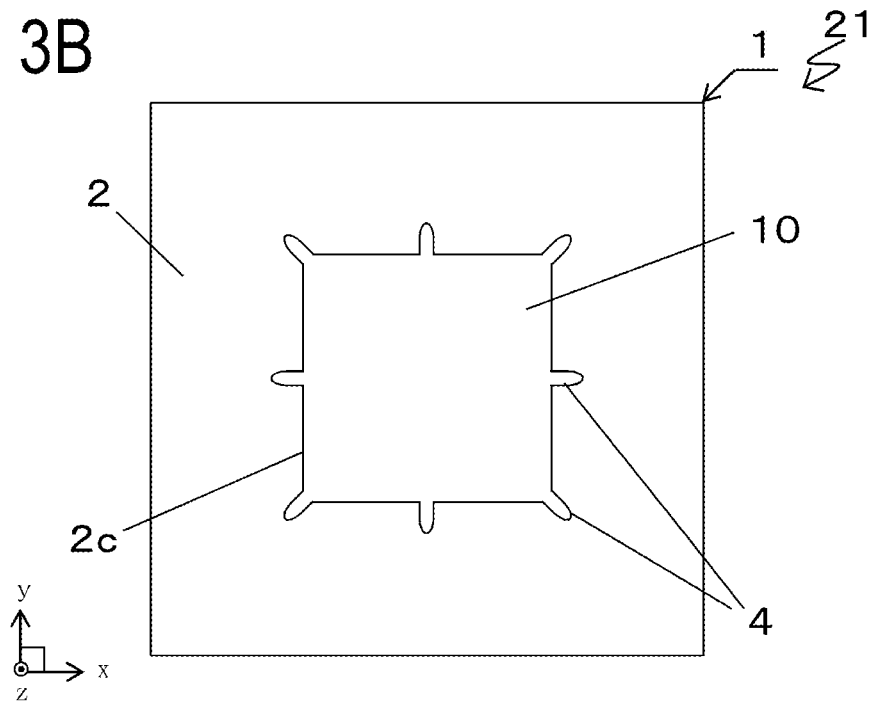

ELECTRONIC ELEMENT MOUNTING SUBSTRATE, AND ELECTRONIC DEVICE

TECHNICAL FIELD

The present invention relates to a substrate for mounting an electronic element, on which an electronic element, such as a charge coupled device (CCD) or a complementary metal oxide semiconductor (CMOS) imaging element, is mounted, and to an electronic device.

BACKGROUND ART

An electronic element mounting substrate including a base body, an electrode, and a pad is known. The base body has a frame shape, and includes a first frame section and a second frame section, the second frame section having an inner surface that protrudes further inward than an inner surface of the first frame section when viewed in plan view. The electrode is disposed on a bottom surface of the first frame portion of the base body. The pad is disposed on a bottom surface of the second frame portion and is electrically connected to the electrode. Furthermore, an electronic device in which an electronic element is mounted on the electronic element mounting substrate and a top surface of the second frame section is covered by a lid is known, as disclosed in JP 2002-299592 A.

When mounting an electronic element or when bonding a lid to a base body, the electronic element or lid is generally mounted by pressing the electronic element or lid against the base body while applying heat. Increases in the performance of electronic elements have resulted in increases in the sizes thereof, and thus more heat is generated when the electronic elements are driven. If heat and stress arising during mounting or heat emitted when driving the electronic element act on the periphery of an opening in the electronic element mounting substrate, the periphery of the opening will likely deform. When the periphery of the opening in the electronic element mounting substrate deforms, there have been situations where stress concentration arises in the deformed area, producing cracks and fissures in the electronic element mounting substrate. There have been situations where such cracks and fissures have caused a drop in the airtightness of the electronic device, or the cracking has produced dust.

An electronic element mounting substrate according to one aspect of the present invention includes a base body, an electrode, and a pad. The base body has a frame shape, and includes a first frame section and a second frame section, the second frame section being disposed on the first frame section and including an inner surface protruding further inward than an inner surface of the first frame section when viewed in plan view. The electrode is disposed on a bottom surface of the first frame section of the base body. The pad is disposed on a bottom surface of a protruding part of the second frame section, and is electrically connected to the electrode. A groove extending in a vertical direction is formed in an inner surface of the protruding part of the second frame section of the base body.

An electronic device according to one aspect of the present invention includes the above-described electronic element mounting substrate, the electronic element mounted on the electronic element mounting substrate, and a lid bonded to a top surface of the electronic element mounting substrate.

BRIEF DESCRIPTION OF DRAWINGS

FIGS. 3A and 3B are top views illustrating the outer appearance of an electronic element mounting substrate and an electronic device according to another aspect of the first embodiment of the present invention.

DESCRIPTION OF EMBODIMENTS

Figure 1A:
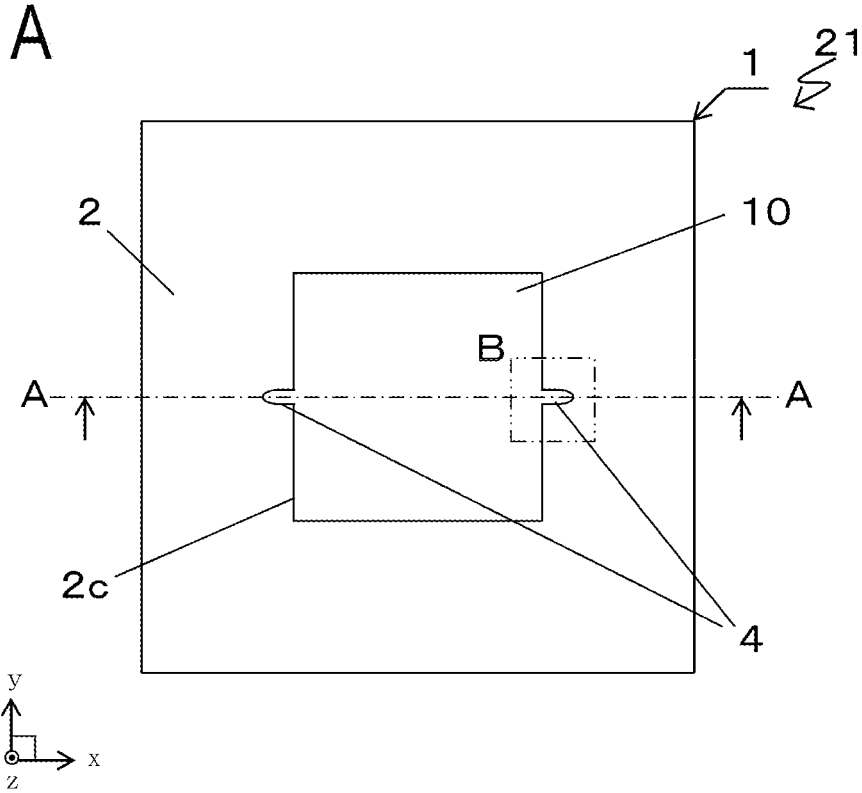
FIG. 1A is a top view illustrating the outer appearance of an electronic element mounting substrate and an electronic device according to a first embodiment of the present invention.
Figure 1B:
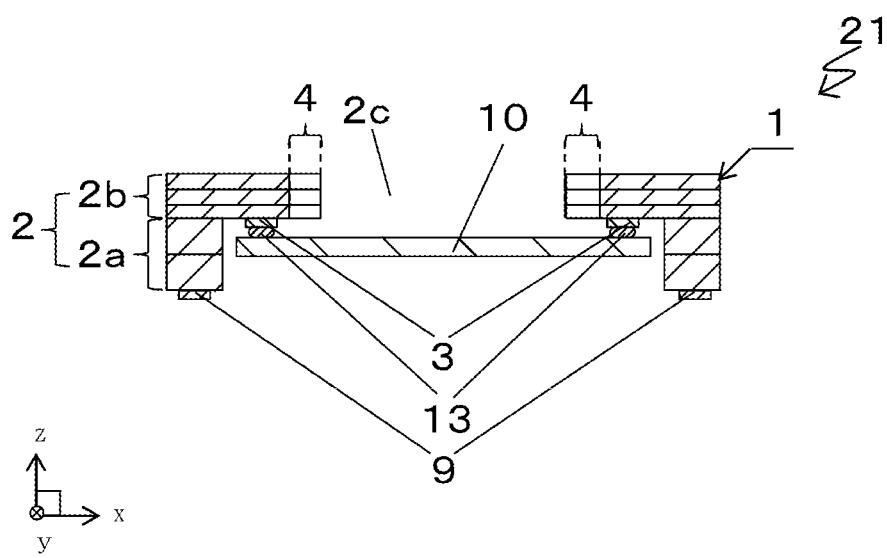
FIG. 1B is a vertical cross-sectional view corresponding to a line A-A in FIG. 1A.
Figure 2A:
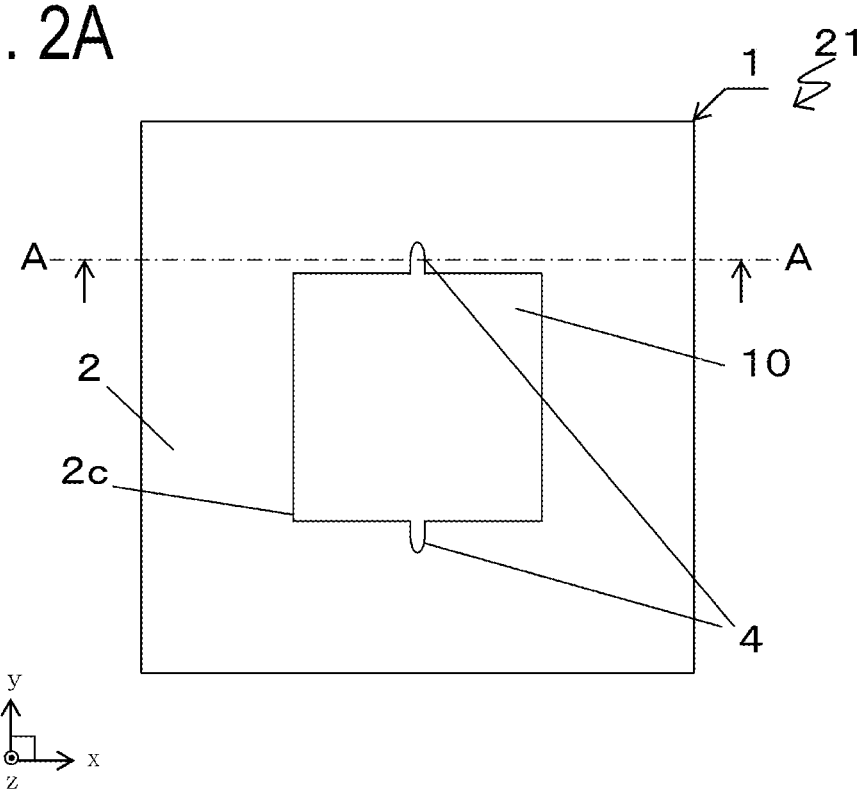
FIG. 2A is a diagram in which the top view illustrating the outer appearance of the electronic element mounting substrate and the electronic device according to the first embodiment of the present invention illustrated in FIG. 1A has been rotated by 90 degrees.
Figure 2B:
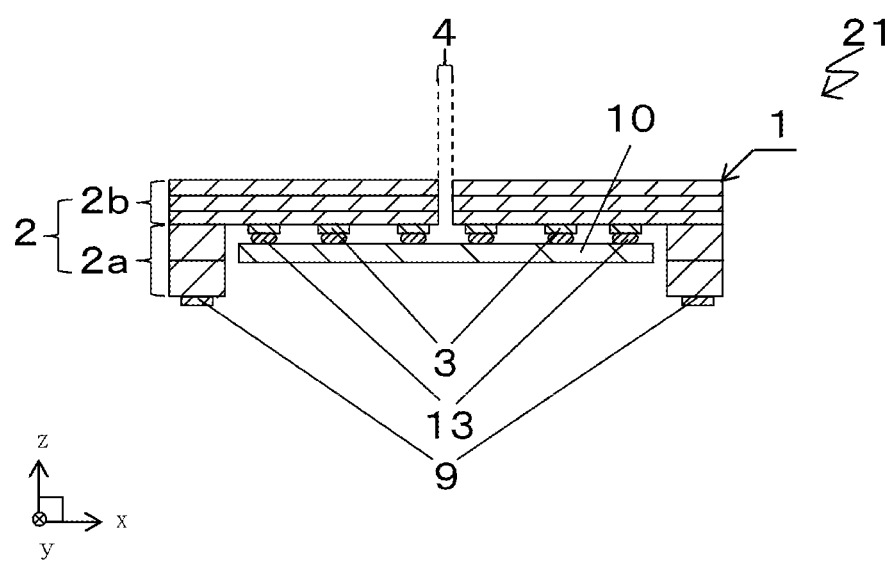
FIG. 2B is a vertical cross-sectional view corresponding to a line A-A in FIG. 2A.

Several exemplary embodiments of the present invention will be described hereinafter with reference to the drawings. The following will describe a configuration in which an electronic element is mounted on an electronic element mounting substrate as an electronic device. Any direction may be defined as upward or downward for the electronic element mounting substrate and the electronic device, but for the sake of convenience, an xyz orthogonal coordinate system will be used here, with a positive side in the z direction being defined as upward and the terms "top surface" and "bottom surface" being used.

First Embodiment

An electronic device 21 and an electronic element mounting substrate 1 according to a first embodiment of the present invention will be described with reference to FIGS. 1A to 7B. The electronic device 21 according to the present embodiment includes the electronic element mounting substrate 1 and an electronic element 10. Note that a lid 12 is not illustrated in FIGS. 1A to 7B. FIGS. 1A to 4 illustrate examples of top views or cross-sectional views according to the present embodiment. FIGS. 5A to 7B illustrate enlarged views of a main part B according to the present embodiment, and several examples thereof. FIG. 7 illustrates an example of a vertical cross-sectional view of a second frame section 2b in the vicinity of a groove 4 according to the present embodiment.

In the example illustrated in FIGS. 1A to 2B, the electronic element mounting substrate 1 includes a base body 2, electrodes 9, and pads 3. The base body 2 has a frame shape, and includes a first frame section 2a and the second frame section 2b, the second frame section 2b being disposed on the first frame section 2a and including an inner surface protruding further inward than an inner surface of the first frame section 2a when viewed in plan view. The electrodes 9 are disposed on a bottom surface of the first frame section 2a of the base body 2. The pads 3 are disposed on a bottom surface of the protruding part of the second frame section 2b, and are electrically connected to the electrodes 9. Grooves 4 extending in a vertical direction are formed in an inner surface of the protruding part of the second frame section 2b of the base body 2. The electrodes 9 are external circuit connection electrodes for connecting to an external circuit substrate. The pads 3 are electronic element connection pads for connecting to the electronic element 10.

The base body 2 is constituted of the first frame section 2a and the second frame section 2b disposed on the first frame section 2a, the second frame section 2b including an inner surface protruding further inward than the inner surface of the first frame section 2a when viewed in plan view. The electronic element mounting substrate 1 includes a frame-shaped base body 2, the electrodes 9 disposed on the bottom surface of the first frame section 2a of the base body 2, and the pads 3, the pads 3 being disposed on a bottom surface of the protruding part of the second frame section 2b and being electrically connected to the electrodes 9. As a material for the base body 2, an electrically insulating ceramic, resin or the like is used, for example.

Examples of the electrically insulating ceramic used as the material for the base body 2 include an aluminum oxide-based sintered body, a mullite-based sintered body, a silicon carbide sintered body, an aluminum nitride-based sintered body, a silicon nitride-based sintered body, and a glass ceramic sintered body. Note that the coefficient of thermal expansion in the case where the base body 2 is an aluminum oxide-based sintered body, which is one of the electrical insulating ceramic materials, is from $6.5 \times 10^{-6}/°$ C. to $8.0 \times 10^{-6}/°$ C., for example.

Examples of the resin used as the material for the base body 2 include an epoxy resin, a polyimide resin, an acrylic resin, a phenol resin, and a fluorine-based resin. Examples of the fluorine-based resin include a polyester resin and an ethylene tetrafluoride resin. Note that the coefficient of thermal expansion in the case where the base body 2 is an epoxy resin, which is one of the resin materials, is from $45 \times 10^{-6}/°$ C. to $65 \times 10^{-6}/°$ C., for example.

In the example illustrated in FIGS. 1A to 2B, the base body 2 is formed by a plurality of electrically insulating layers made from the above-described material being layered in the up-down direction, for example. The base body 2 may be formed of five layers of the electrically insulating layers as in the examples illustrated in FIGS. 1A and 1B and in FIGS. 2A and 2B, or may be formed of two to four layers or six or more layers of the electrically insulating layers. The base body 2 has, for example, a rectangular outer shape when viewed in plan view. The length of one side of the outer shape of the substrate 2 is from 3 to 100 mm, and the length of the substrate 2 in the vertical direction is from 0.5 to 20 mm. The length of one side of an opening 2c is from 2 to 90 mm when viewed in plan view.

The interior of the base body 2 may be disposed with an internal wiring electrical conductor, which is formed of through electrical conductors that cause electrical conduction between each of the electrically insulating layers and internal wiring. The base body 2 may include an external wiring electrical conductor exposed on the surface of the base body 2. In addition, the internal wiring electrical conductor disposed inside the electrically insulating layers forming the base body 2 may be electrically connected by the external wiring electrical conductor exposed at the surface of the electrically insulating layers and the like. Here, the external wiring electrical conductor is a wiring electrical conductor exposed on the exterior of the base body 2, with the exception of the pads 3 and the electrodes 9.

In the case where the base body 2 is made from an electrically insulating ceramic, the pads 3 and the electrodes 9 are made from a metal material. Tungsten (W), molybdenum (Mo), manganese (Mn), silver (Ag), or copper (Cu) can be given as example of the metal material. The pads 3 and the electrodes 9 are made from an alloy or the like containing at least one metal material selected from these metal materials. In the case where the base body 2 is made from a resin, the pads 3, the electrodes 9, the internal wiring electrical conductor, and the external wiring electrical conductor are made from a metal material, for example. Copper (Cu), gold (Au), aluminum (Al), nickel (Ni), chromium (Cr), molybdenum (Mo), and titanium (Ti) can be given as examples of the metal material. The pads 3 and the electrodes 9 are made from an alloy or the like containing at least one metal material selected from these metal materials.

A plating layer may be disposed on the exposed surfaces of the pads 3, the electrodes 9, and the external wiring electrical conductor. According to this configuration, the exposed surfaces of the pads 3, the electrodes 9, and the external wiring electrical conductor can be protected and made less susceptible to oxidization. Further, according to this configuration, electrical connectivity between the pads 3 and the electronic element 10 via connecting members 13 (Au balls and the like) can be favorably ensured. As the plating layer, an Ni plating layer with a thickness of from 0.5 to 10 μm is deposited. In addition, a gold (Au) plating layer with a thickness of from 0.5 to 3 μm may be deposited on top of the Ni plating layer.

In the example of the present embodiment illustrated in FIGS. 1A to 7B, the groove 4 extending in the vertical direction is formed in the inner surface of the protruding part of the second frame section 2b of the base body 2 in the electronic element mounting substrate 1.

When mounting the electronic element 10 or when bonding the lid 12 to the base body 2, the electronic element 10 is generally mounted by pressing the electronic element 10 or lid 12 against the base body 2 while applying heat. Meanwhile, the electronic element 10 has become larger with improvements in the performance of the electronic element 10, and thus an increased amount of heat is emitted when the electronic element 10 is driven. Furthermore, in response to demand to make the electronic device 21 thinner, the base body 2 is becoming thinner as well. In light of these conditions, if heat and stress arising during the mounting of the electronic element 10 or heat emitted when driving the electronic element 10 act on the periphery of the opening 2c in the electronic element mounting substrate 1, the periphery of the opening 2c may deform. In the case where the periphery of the opening 2c in the electronic element mounting substrate 1 deforms, there have been situations where stress concentration arises in the deformed area, producing cracks and fissures in the electronic element mounting substrate 1. There have been situations where such cracks and fissures in the electronic element mounting substrate 1 have caused a drop in the airtightness of the electronic device 21, or the cracking has produced dust.

In response to this, in the example of the present embodiment illustrated in FIGS. 1A to 7B, the groove 4 extending in the vertical direction is formed in the inner surface of the protruding part of the second frame section 2b of the base body 2 in the electronic element mounting substrate 1, and thus stress from the top surface or the bottom surface of the base body 2 can be absorbed by the groove 4. Accordingly, even if stress or heat acts to deform the periphery of the opening 2c in the electronic element mounting substrate 1 when the electronic element 10 is mounted on the electronic element mounting substrate 1 or the electronic element 10 is driven, the concentration of stress at the location where the base body 2 has deformed can be reduced. This makes it possible to reduce the formation of cracks, fissures, and the like in the electronic element mounting substrate 1.

Additionally, when the base body 2 having the opening 2c in the center of the base body 2 is manufactured, it is generally likely that the periphery of the opening 2c will deform in the manufacturing process. In such a case, it is assumed that the electronic element 10 is mounted by pressing the electronic element 10 or the lid 12 against the base body 2 while applying heat. As a result, it has been possible for stress concentration to arise in the area where the base body 2 has deformed during the manufacture of the base body 2, and for cracks, fissures, or the like to arise in the electronic element mounting substrate 1. As opposed to this, in the example of the present embodiment illustrated in FIGS. 1A to 7B, the groove 4 extending in the vertical direction is formed in the inner surface of the protruding part of the second frame section 2b of the base body 2 in the electronic element mounting substrate 1. Here, stress from the top surface or the bottom surface at the deformed area in the periphery of the opening in the second frame section 2b can be dissipated to the groove 4. Accordingly, situations where stress concentrates at the area in the periphery of the opening 2c in the electronic element mounting substrate 1 that has deformed during the manufacture of the base body 2 can be reduced. In other words, this can reduce the formation of cracks, fissures, and the like in the electronic element mounting substrate 1.

Although the groove 4 penetrates the second frame section 2b from the top surface side to the bottom surface side thereof in the example illustrated in FIGS. 1A to 2B, the groove 4 may be disposed extending from the top surface side to the bottom surface side of the second frame section 2b to an intermediate section of the second frame section 2b. Note that the groove 4 is not limited to a shape that penetrates from the top surface of the second frame section 2b to the bottom surface of the second frame section 2b, and may have a shape that does not penetrate in the vertical direction.

Additionally, in the examples illustrated in FIGS. 1A to 3A, the second frame section 2b is rectangular, and the groove 4 is disposed in both of sides of the rectangle that face each other. As a result, when mounting the lid 12 or the electronic element 10, stress can dissipate uniformly in the grooves 4 disposed in both of the sides of the rectangle that face each other even if pressure is exerted orthogonally from the top surface or bottom surface side of the base body 2. Situations in which the lid 12 or the electronic element 10 is mounted with an imbalanced amount of deformation in the base body 2 in the periphery of the opening 2c can therefore be reduced. Accordingly, situations where stress concentrates at the area in the periphery of the opening 2c in the electronic element mounting substrate 1 that has deformed and cracks or the like arise can be reduced by the grooves 4. The mounting precision of the lid 12 or the electronic element 10 of the electronic device 21 can also be improved. Note that at this time, forming the grooves 4 in the respective sides of the rectangle so as to be symmetrical as in the example illustrated in FIG. 3A makes it possible to reduce situations in which the lid 12 or the electronic element 10 is mounted with an imbalanced amount of deformation in the base body 2 in the periphery of the opening 2c.

Additionally, in the example illustrated in FIG. 3B, the second frame section 2b is rectangular, and the groove 4 is disposed in each of corner portions where adjacent sides of the second frame section 2b intersect. As a result, situations where the base body 2 deforms in the periphery of the opening 2c when the electronic element mounting substrate 1 is manufactured can be reduced. Meanwhile, it is generally easy for cracks to form when stress concentrates in the corner portions of the base body 2. In light of this, providing the grooves 4 in the corner portions where adjacent sides of the second frame section 2b intersect makes it possible to reduce situations where deformation arises in the corner portions, and alleviate stress acting on the corner portions. Accordingly, situations where stress concentrates at the area in the periphery of the opening 2c in the electronic element mounting substrate 1 that has deformed can be reduced. This in turn makes it possible to reduce the formation of cracks, fissures, and the like in the electronic element mounting substrate 1.

Figure 4:
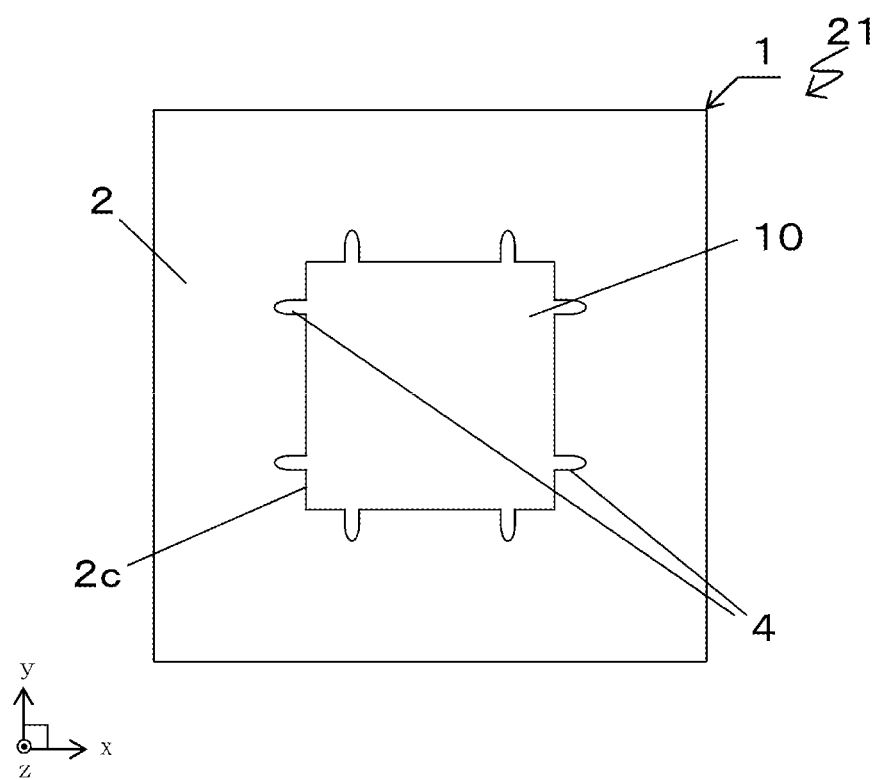
FIG. 4 is a top view illustrating the outer appearance of an electronic element mounting substrate and an electronic device according to another aspect of the first embodiment of the present invention.

Additionally, in the example illustrated in FIG. 4, the second frame section 2b is rectangular, and the groove 4 is disposed in the vicinity of each of corner portions where adjacent sides of the second frame section 2b intersect. This makes it possible to suppress a situation where the base body 2 deforms in the periphery of the opening 2c when manufacturing the electronic element mounting substrate 1, the corner portions bulge toward the top surface side or the bottom surface side, and the balance of the base body 2 on the top surface or the bottom surface decreases. This in turn makes it possible to reduce situations in which the lid 12 is mounted at an angle when mounting the lid 12. It is also possible to reduce situations in which the corner portions bulging toward the bottom surface side make contact with the electronic element 10 and damage the electronic element 10. Additionally, providing the grooves 4 in the periphery of the corner portions where adjacent sides of the second frame section 2b intersect makes it possible to reduce situations where deformation arises in the corner portions, and alleviate stress acting on the corner portions. Accordingly, situations where stress concentrates at the area in the periphery of the opening 2c in the electronic element mounting substrate 1 that has deformed can be reduced. In other words, this can reduce the formation of cracks, fissures, and the like in the electronic element mounting substrate 1.

Figure 5A:
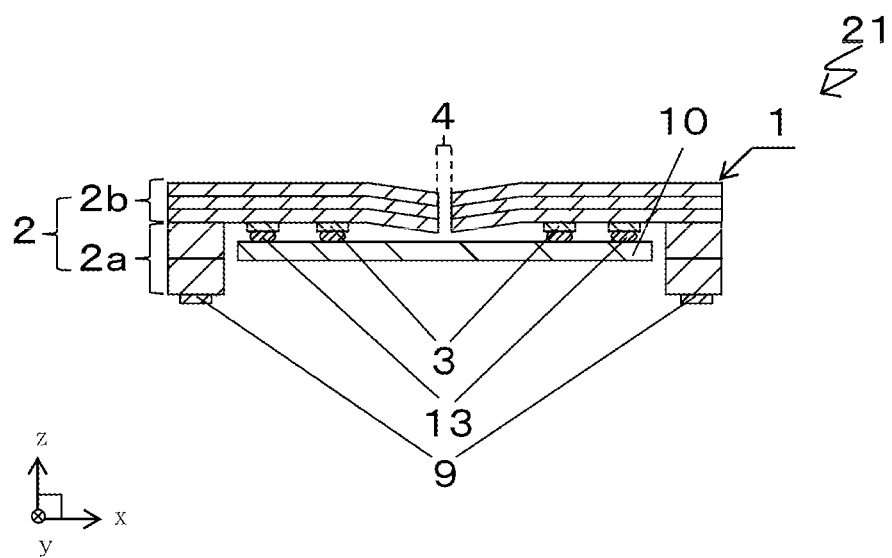
FIGS. 5A and 5B are vertical cross-sectional views illustrating the outer appearance of an electronic element mounting substrate and an electronic device according to another aspect of the first embodiment of the present invention.
Figure 5B:
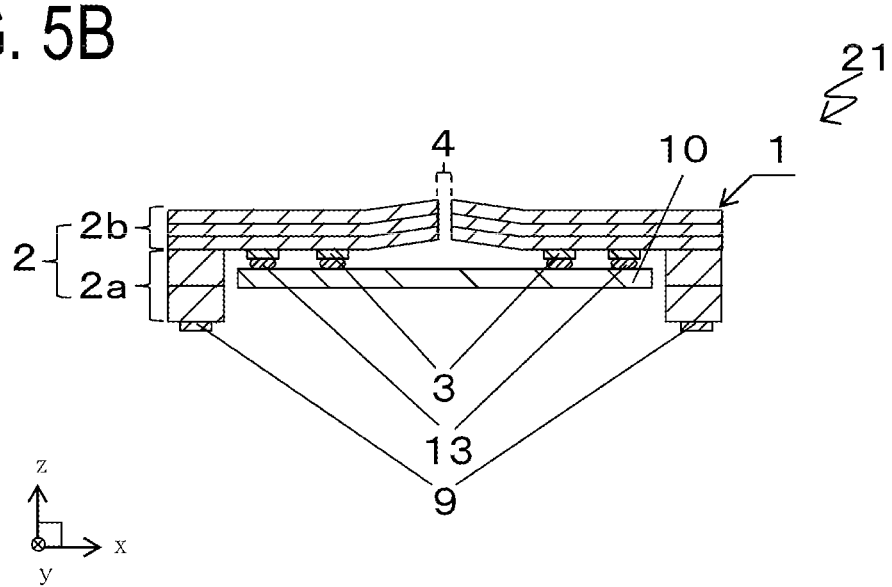

Meanwhile, in the example illustrated in FIGS. 5A and 5B, the second frame section 2b is, when viewed as a cross-section, deformed toward the top surface side or the bottom surface side in the vicinity of the grooves 4. In other words, the periphery of the grooves 4 in the second frame section 2b are sloped upward or downward. Providing the grooves 4 so as to overlap with a central portion of an area of high deformation in the base body 2 in this manner makes it possible to reduce situations in which stress acts directly on parts where the most stress acts when mounting the electronic element 10 or the lid 12. By doing so, situations where stress concentrates at the area in the periphery of the opening 2c in the electronic element mounting substrate 1 that has deformed can be reduced more effectively. In other words, this can reduce the formation of cracks, fissures, and the like in the electronic element mounting substrate 1.

The width of the groove 4 is, for example, approximately from 0.1 to 1 mm, and the width in the depth direction is also approximately from 0.1 to 1 mm. Additionally, setting the width to not greater than 30% of the size of one side of the opening 2c makes it possible to reduce situations where debris such as dust in the air makes contact with the electronic element 10 via the groove 4, while also favorably alleviating deformation at the opening 2c in the base body 2.

Next, the electronic device 21 will be described with reference to FIGS. 1A to 2B. In the example illustrated in FIGS. 1A to 2B, the electronic device 21 includes the electronic element mounting substrate 1 and the electronic element 10 mounted on the electronic element mounting substrate 1.

For example, an imaging device, such as a CCD type imaging device or a CMOS type imaging device, a light emitting element such as an LED, or a semiconductor circuit element is used as the electronic element 10. In the example illustrated in FIGS. 1A to 2B, each of the electrodes of the electronic element 10 is electrically connected to the pad 3 using the connecting members 13. Additionally, in the example illustrated in FIGS. 1A to 2B, the electronic element 10 and the electronic element mounting substrate 1 are connected by the connecting members 13, and the connecting members 13 may be balls made from gold or solder, anisotropic electrically conductive resin made from a resin, or the like.

By using the electronic element mounting substrate 1 according to the present invention, the electronic device 21 according to the present invention can maintain favorable airtightness, and thus the reliability of the electronic device 21 can be improved.

Next, an example of a manufacturing method of the electronic element mounting substrate 1 according to the present embodiment will be described. Note that the example of the manufacturing method described below is a manufacturing method that uses a multipiece wiring base plate.

(1) First, ceramic green sheets that configure the substrate 2 are formed. For example, in the case of obtaining the base body 2 from an aluminum oxide ($Al_2O_3$)-based sintered compact, a powder such as silica ($SiO_2$), magnesia ($MgO$), or calcia ($CaO$) is added as a sintering aid to the $Al_2O_3$ powder. A suitable binder, a solvent, and a plasticizer are furthermore added, and the mixture is kneaded together into a slurry. Then, multipiece ceramic green sheets are obtained through a formation method such as a doctor blade method or a calender roll method.

Note that when the substrate 2 is formed from a resin, for example, the substrate 2 can be formed through a method such as a transfer mold method or an injection mold method, using a mold that enables the resin to be formed into a predetermined shape.

Meanwhile, the substrate 2 may be formed by impregnating a base material formed of glass fibers with a resin, such as glass epoxy resin. In this case, the substrate 2 can be formed by impregnating a base material formed of glass fibers with an epoxy resin precursor and thermally curing the epoxy resin precursor at a predetermined temperature.

(2) Next, using a screen printing method, a section of the ceramic green sheet is coated or filled with a metal paste, the section of the ceramic green sheet being obtained in the above-described step (1) that will become the pads 3, the electrodes 9, and the internal wiring electrical conductor including the through electrical conductor and the internal wiring.

This metal paste is prepared and created so as to have an appropriate viscosity by adding a suitable solvent and binder to the metal powder formed of the above-described metal materials, and kneading the mixture. Note that glass, ceramics, and the like may also be included in the metal paste in order to increase the bonding strength with the substrate 2.

(3) Next, the ceramic green sheets that will form the base body 2 are manufactured. Meanwhile, to manufacture the frame-shaped base body 2, there is a method in which, for example, ceramic green sheets that will form the first frame section 2a and the second frame section 2b are manufactured and then integrated through a process of layering and pressurizing the sheets, which will be described later. For example, the ceramic green sheet that forms the first frame section 2a and the second frame section 2b can be formed using one of a metal mold and laser processing to stamp out a section forming an opening 2c. Alternatively, the plurality of ceramic green sheets may first be layered and compressed and the section forming the opening 2c may then be stamped out from the ceramic green sheet layered body.

At this time, the grooves 4 can be formed by forming holes that will serve as the grooves 4 in the ceramic green sheets that will form the second frame section 2b, and providing the opening 2c so that the grooves 4 are divided in the ceramic green sheets. The grooves 4 may instead be formed in the ceramic green sheets that will form the second frame section 2b in which the opening 2c is already disposed. At this time, the ceramic green sheets that will form the second frame section 2b made from a plurality of layers disposed with the grooves 4 may be layered in advance, or the grooves 4 may be disposed first and the plurality of ceramic green sheets are layered thereafter. A punching process using a metal mold or laser processing, for example, can be used as the method for forming through-holes that will form the grooves 4.

(4) Next, the ceramic green sheet layered body that will form the substrate 2 is created by layering and compressing the ceramic green sheets that serve as each electrically insulating layer. At this time, the ceramic green sheet layered body that will form the base body 2 can be created by layering and compressing the ceramic green sheet that serves as the above-described first frame section 2a and the ceramic green sheet that serves as the above-described second frame section 2b.

(5) Next, the ceramic green sheet layered body is fired at a temperature of approximately 1500 to 1800° C. to obtain a multipiece board on which a plurality of the base bodies 2 are arranged. Note that, in this step, the above-described metal paste is fired at the same time as the ceramic green sheets forming the base body 2, and forms the pads 3, the electrodes 9, the internal wiring electrical conductor, or the external wiring electrical conductor.

(6) Next, the multipiece wiring board obtained by the firing is divided into the plurality of substrates 2. In this division, split grooves are formed in the multipiece wiring board along areas that will serve as outer edges of the base body 2. In the division, a method can be used in which the multipiece wiring board is divided along the split grooves, or a method can be used in which the multipiece wiring board is cut, by slicing and the like, along the locations that will serve as the outer edges of the base bodies 2. Note that the split grooves can be formed by forming cuts in the multipiece wiring board at a depth less than the thickness of the multipiece wiring board using a slicing device after the firing. At this time, the division may include pressing a cutter blade against the ceramic green sheet layered body used as the multipiece wiring board, or by forming cuts using a slicing device at a depth less than the thickness of the ceramic green sheet layered body.

Through the above-described steps (1) to (6), the electronic element mounting substrate 1 is obtained. Note that an order of the above-described steps (1) to (6) is not prescribed. The electronic device 21 can be manufactured by mounting the electronic element 10 on the electronic element mounting substrate 1 formed in this manner.

Next, the shape of the grooves 4 according to the present embodiment will be described using FIGS. 6A to 7B. FIGS. 6A to 7B are enlarged views of the main part B (the grooves 4) according to the present embodiment illustrated in FIG. 1.

In the example illustrated in FIG. 5A, the groove 4 is shaped like a square with one side open when viewed in plan view. Accordingly, when stress acting from the top surface or the bottom surface of the base body 2 is alleviated by the grooves 4, the stress can be alleviated starting from two corner portions, and can thus be alleviated more favorably. Additionally, if the groove 4 has a polygonal shape as in the example illustrated in FIG. 5A and the example illustrated in FIG. 5B, which will be described later, it is easy to form and design the groove 4.

In the example illustrated in FIG. 5B, the groove 4 has a pentagonal shape when viewed in plan view. Accordingly, the angles formed by the respective sides can be set to not less than 90 degrees. As such, when stress acting from the top surface or the bottom surface of the base body 2 is alleviated using the grooves 4, stress acting on the corner portions of the grooves 4 can be alleviated, and situations in which cracks and the like form in the corner portions of the grooves 4 can be reduced. Additionally, in the example illustrated in FIG. 5B, the groove 4 is disposed so that the corner portion thereof overlaps with a central line of that groove 4. Thus, when stress is alleviated using the groove 4, the stress can be alleviated in the vertical direction, starting from the corner portion overlapping with the central line, making it possible to more favorably alleviate the stress.

Figure 6A:
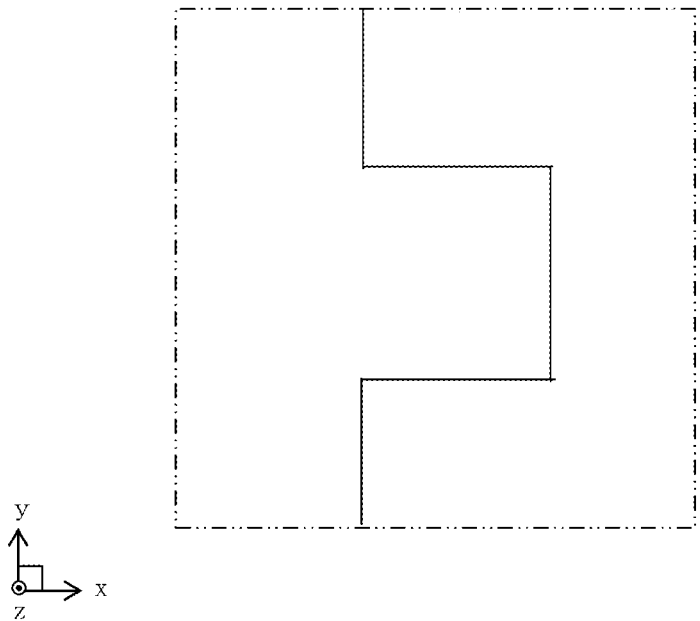
FIGS. 6A and 6B are enlarged views illustrating a main part B of an electronic element mounting substrate according to another aspect of the first embodiment of the present invention.

In the example illustrated in FIG. 6A, the groove 4 has a circular shape when viewed in plan view. In the example illustrated in FIG. 6B, the groove 4 has an elliptical shape when viewed in plan view. Accordingly, when stress acting from the top surface or the bottom surface of the base body 2 is alleviated using the grooves 4, there are no corner portions in the groove 4, and thus it is difficult for stress to concentrate. Thus, situations in which cracks and the like form in the periphery of the groove 4 can be reduced. Note that the grooves 4 need not have perfect circular shapes or elliptical shapes when viewed in plan view, and include shapes resulting from manufacturing error as well. For example, a shape that is partially distorted rather than being a perfect circle when viewed in plan view is also included.

In the case where the base body 2 is made from an electrically insulating ceramic, for example, the grooves 4 can be formed having a desired shape as in the examples illustrated in FIGS. 5A to 6B by using a metal mold having the desired shape to punch out the ceramic green sheets that will form the base body 2. The grooves 4 can also be formed in the desired shape using a laser or the like, for example.

Note that in the case where the width of the base body 2 located between the grooves 4 and the opening 2c is lower (thinner), an appropriate width can be achieved by providing a straight portion between the grooves 4 and the opening 2c, as in the example illustrated in FIG. 6A. Doing so makes it possible to reduce situations where fissures, cracks, and the like form in the base body 2 between the grooves 4 and the opening 2c.

Second Embodiment

The electronic element mounting substrate 1 and the electronic device 21 according to a second embodiment of the present invention will be described next with reference to FIGS. 8A to 9B. In the top views in FIGS. 8A and 9A, an area inside the lid 12 is indicated by a dashed line, and the grooves 4 are indicated by dotted lines.

The electronic device 21 according to the present embodiment differs from the electronic device 21 according to the first embodiment in that the electronic device 21 includes the lid 12, with a gap between the lid 12 and the base body 2 filled with a bonding material 14 and a gap between the base body 2 and the electronic element 10 filled with a sealing material 15.

In the examples illustrated in FIGS. 8A to 9B, the electronic device 21 includes the electronic element mounting substrate 1 of the present invention, the electronic element 10 connected to the pads 3 and connected to the bottom surface of the second frame section 2b, and the lid 12 disposed on the top surface of the second frame section 2b. The electronic device 21 uses the electronic element mounting substrate 1 having the grooves 4. This makes it possible to reduce situations where pressure arising when bonding the electronic element 10 or the lid 12 to the electronic element mounting substrate 1 causes cracks, fissures, or the like to form. A favorable airtightness can therefore be maintained for the electronic device 21. Additionally, situations where fissures form in the base body 2 when bonding the electronic element 10 or the lid 12 can be reduced. This in turn makes it possible to reduce dust produced by the formation of fissures in the base body 2.

In the example illustrated in FIGS. 8A to 9B, the lid 12 is bonded to the second frame section 2b by the bonding material 14, and the grooves 4 are filled with the bonding material 14. Generally speaking, there is demand for the electronic device 21 to be made smaller, whereas increases in the performance of the electronic element 10 have given rise to demand for the opening 2c disposed in the base body 2 to be larger. As such, the bonding area between the lid 12 and the base body 2 is small. Thus, in the case where, for example, the electronic element 10 is an imaging device, there is concern that the bonding material 14 will flow into a central portion of the lid 12 when the bonding material 14 is applied and result in image noise and the like. By providing the grooves 4 in the base body 2 in this manner, the bonding material 14 will flow into the grooves 4, which makes it possible to reduce situations where the bonding material 14 flows out into the central portion of the lid 12. Thus, in the case where the electronic device 21 is an imaging device, for example, image noise caused by the bonding material 14 can be reduced.

Additionally, because the bonding area is small, there have been situations where the bonding material 14 cannot spread out sufficiently when bonding the lid 12 to the base body 2, resulting in an inconsistent thickness of the bonding material 14 such that the lid 12 cannot be bonded parallel to the electronic element 10. When the electronic device 21 is an imaging device, for example, bonding the lid 12 at an angle has resulted in situations where light passing through the lid 12 refracts and the imaging element receives the refracted light, resulting in image noise. Here, by providing the grooves 4 in the base body 2, the bonding material 14 flows into the grooves 4, which makes it easy to keep the thickness of the bonding material 14 constant. The lid 12 can therefore be bonded parallel to the electronic element 10. This makes it possible to reduce image noise when the electronic device 21 is an imaging device, for example.

The bonding material 14 is a resin such as a thermosetting resin, a brazing material made from a metal material, or the like. Here, in the case where the electronic element 10 mounted on the electronic element mounting substrate 1 is a semiconductor circuit element, a gyro sensor, or the like, the lid 12 may be formed from a material that is not light-permeable, such as a metal or a resin.

Meanwhile, in the case where the electronic element 10 mounted on the electronic element mounting substrate 1 is a charge coupled device (CCD) or a complementary metal oxide semiconductor (CMOS) imaging element or a light emitting element such as a light emitting diode (LED), the lid 12 is formed from a material that is light-permeable. Glass, crystal, and resin can be given as example of light-permeable materials. The lid 12 has, for example, a rectangular outer shape when viewed in plan view, with the length of one side of the outer shape being from 2.5 to 95 mm, and the length in the vertical direction being from 0.1 to 5 mm, for example. In the case where the lid 12 is made from glass, the coefficient of thermal expansion of the lid 12 is, for example, from $6 \times 10^{-6}/°$ C. to $11 \times 10^{-6}/°$ C.

Additionally, providing the grooves 4 in locations overlapping with the lid 12 when viewed in plan view as in the example illustrated in FIGS. 8A to 9B makes it possible to favorably reduce situations where debris such as dust in the air makes contact with the electronic element 10 via the grooves 4.

Additionally, in the example illustrated in FIGS. 8A to 9B, the area between the electronic element 10 and the second frame section 2b is sealed by the sealing material 15, with the sealing material 15 flowing into and rising up along the grooves 4. Generally speaking, there is demand for the electronic device 21 to be made smaller, whereas increases in the performance of the electronic element 10 have given rise to demand for the opening 2c disposed in the base body 2 to be larger. As such, the sealing area between the electronic element 10 and the base body 2 is small. As such, when applying the sealing material 15, there have been situations where the sealing material 15 flows into the central portion of the electronic element 10, and in the case where the electronic device 21 is an imaging device, for example, the sealing material 15 has flowed into a light-receiving area and caused image noise. By providing the grooves 4 in the base body 2 in this manner, the sealing material 15 will flow into and rise along the grooves 4, which makes it possible to reduce situations where the sealing material 15 flows out into the central portion of the electronic element 10. Thus, in the case where the electronic device 21 is an imaging device, for example, image noise caused by the sealing material 15 can be reduced. Note that a typical thermosetting resin or the like is used as the sealing material 15.

Additionally, when both the bonding material 14 and the sealing material 15 flow into the grooves 4 as in the example illustrated in FIGS. 8A to 9B, the bonding material 14 and the sealing material 15 can be accumulated in the grooves 4. This makes it possible to reduce the thickness of the bonding material 14 and the sealing material 15 by the amount of the bonding material 14 and the sealing material 15 that has flowed into the grooves 4. The height of the electronic device 21 can therefore be reduced.

Figure 6B:
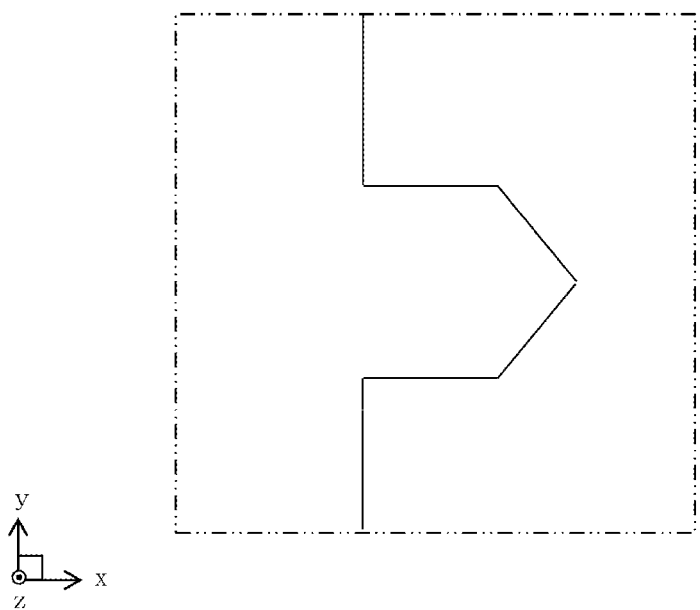
Figure 7A:
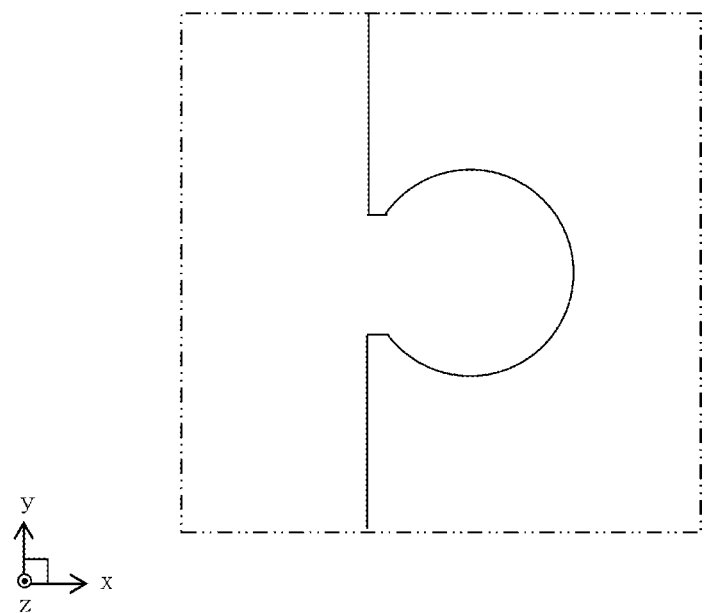
FIGS. 7A and 7B are enlarged views illustrating a main part B of an electronic element mounting substrate according to another aspect of the first embodiment of the present invention.
Figure 7B:
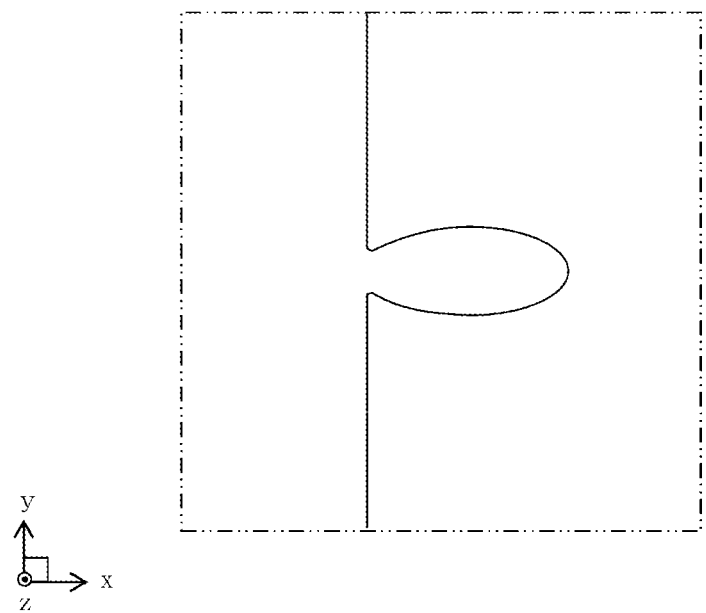
Figure 8A:
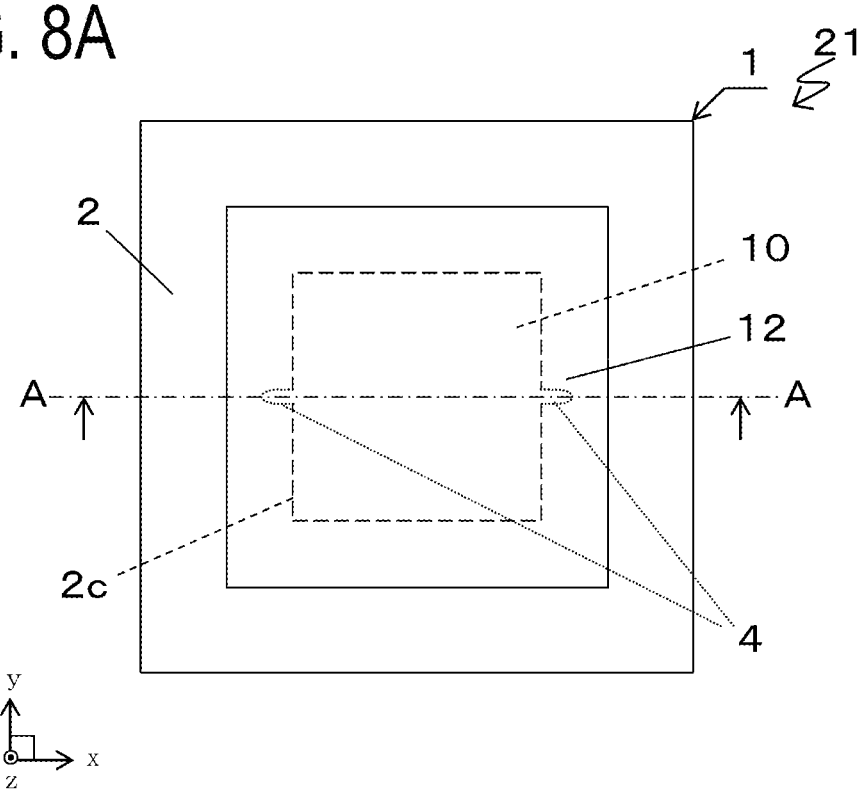
FIG. 8A is a top view illustrating the outer appearance of an electronic element mounting substrate and an electronic device according to a second embodiment of the present invention.
Figure 8B:
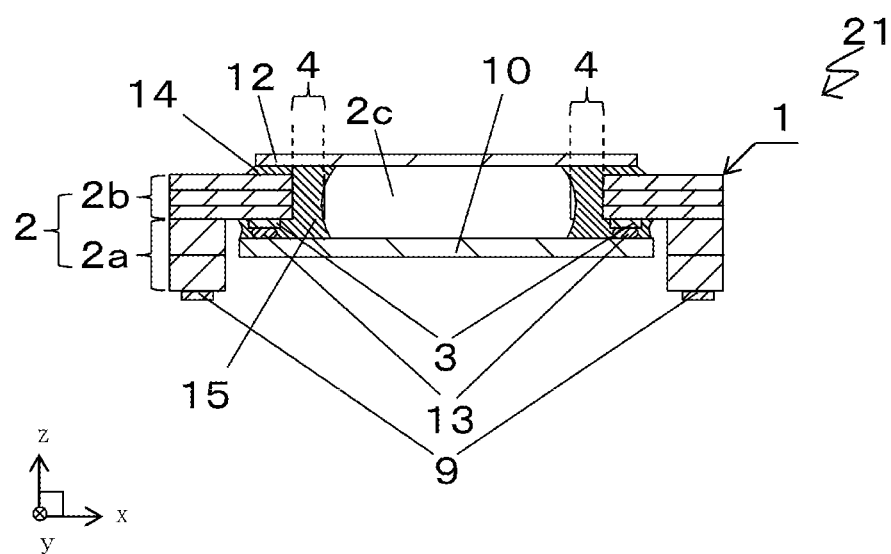
FIG. 8B is a vertical cross-sectional view corresponding to a line A-A in FIG. 8A.
Figure 9A:
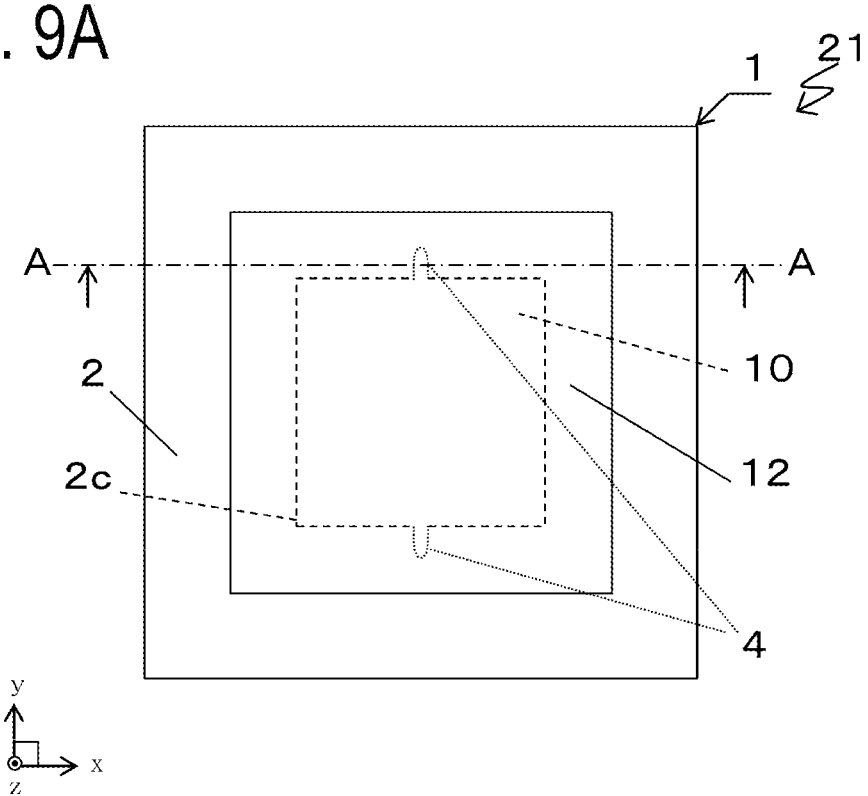
FIG. 9A is a diagram in which the top view illustrating the outer appearance of the electronic element mounting substrate and the electronic device according to the second embodiment of the present invention illustrated in FIG. 8A has been rotated by 90 degrees.
Figure 9B:
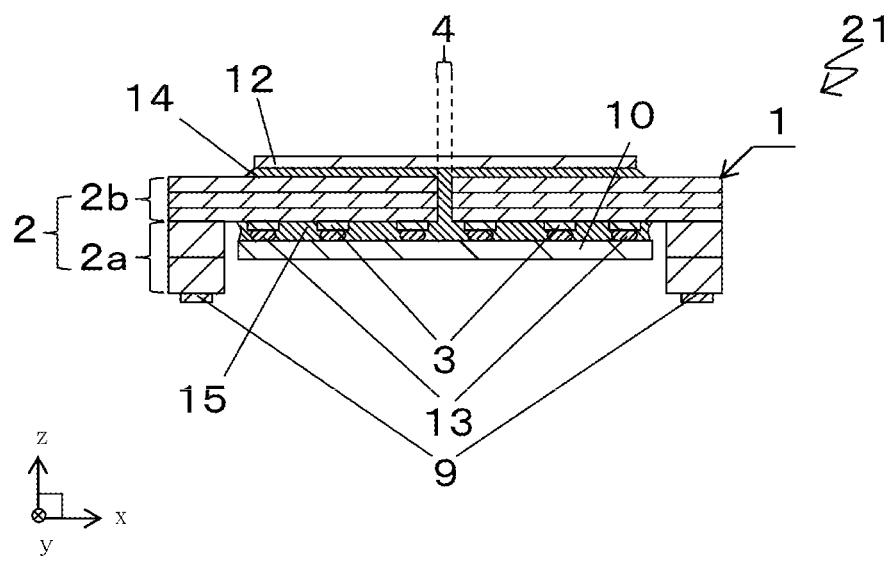
FIG. 9B is a vertical cross-sectional view corresponding to a line A-A in FIG. 9A.
Figure 10A:
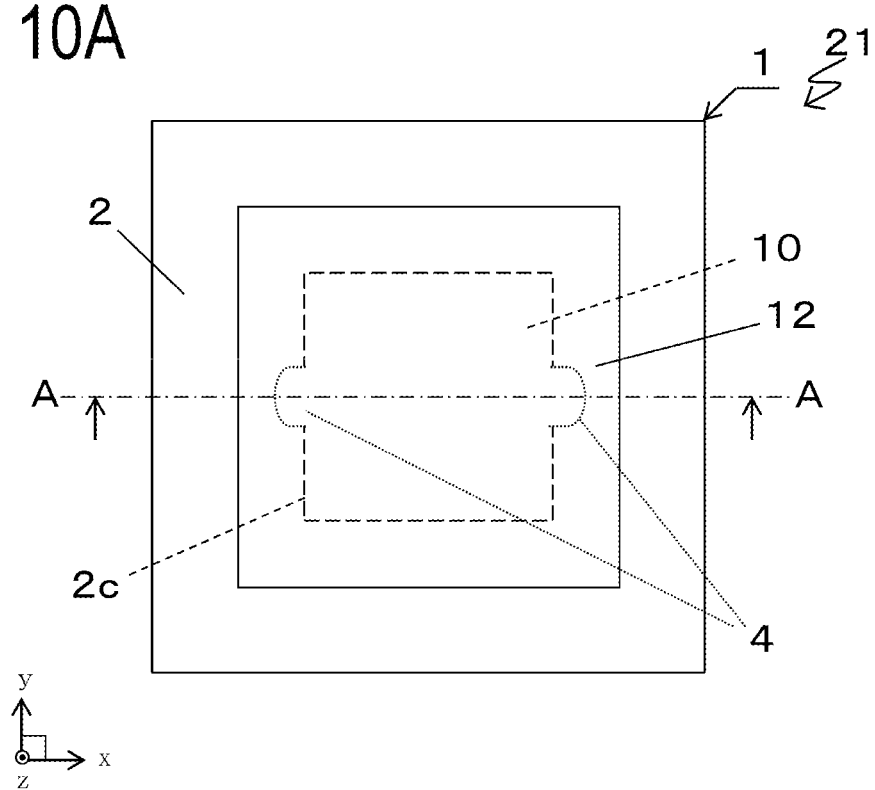
FIG. 10A is a top view illustrating the outer appearance of an electronic element mounting substrate and an electronic device according to a third embodiment of the present invention.
Figure 10B:
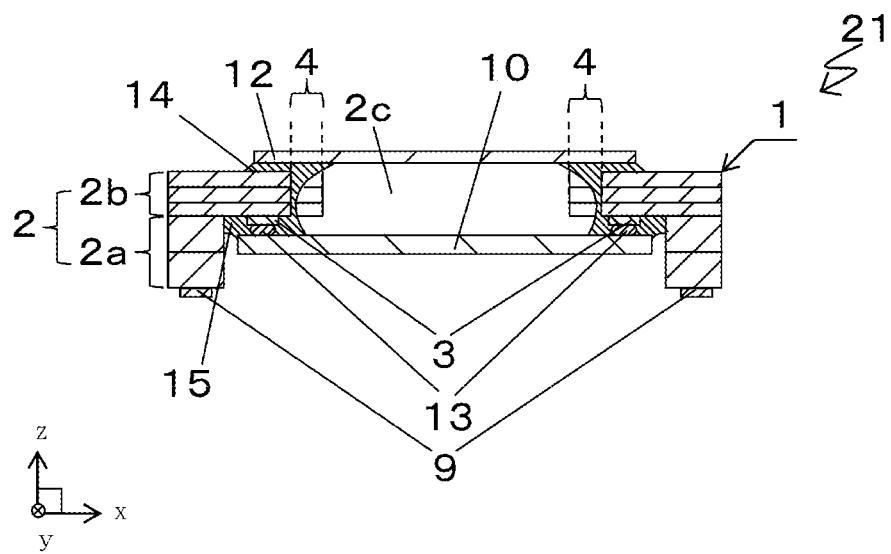
FIG. 10B is a vertical cross-sectional view corresponding to a line A-A in FIG. 10A.
Figure 11A:
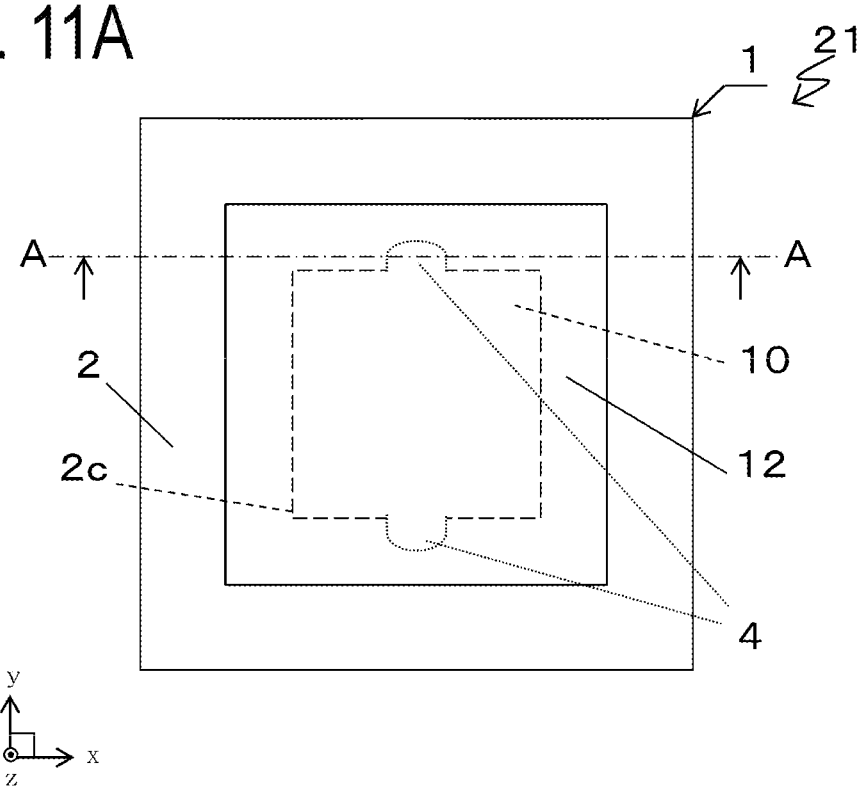
FIG. 11A is a diagram in which the top view illustrating the outer appearance of the electronic element mounting substrate and the electronic device according to the third embodiment of the present invention illustrated in FIG. 10A has been rotated by 90 degrees.
Figure 11B:
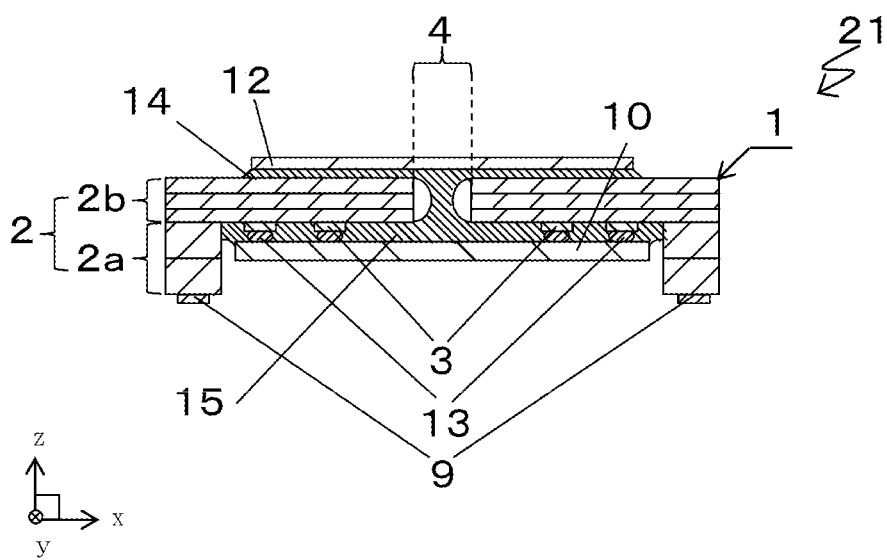
FIG. 11B is a vertical cross-sectional view corresponding to a line A-A in FIG. 11A.

Additionally, in the example illustrated in FIGS. 8A to 9B, the grooves 4 have circular shapes or elliptical shapes when viewed in plan view (see FIGS. 6A and 6B). Accordingly, in the case where the electronic element 10 operates and produces heat, and the bonding material 14 or the sealing material 15 that has flowed into the grooves 4 is heated and thermally expands, stress arising from differences in the thermal expansion of the base body 2 and the bonding material 14 or the sealing material 15 can be alleviated. This in turn makes it possible to reduce situations where cracks or the like form in the base body 2, in the periphery of the grooves 4.

Additionally, when viewed in plan view, the groove 4 is shaped such that the width thereof is narrowed on the opening 2c side (see FIGS. 6A and 6B), and thus it is possible to reduce situations where the bonding material 14 or the sealing material 15 flows out into the central portion of the lid 12 or the central portion of the electronic element 10.

Additionally, in the example illustrated in FIGS. 8A to 9B, the bonding material 14 and the sealing material 15 used in the electronic device 21 may be made from the same type of material, or the bonding material 14 and the sealing material 15 may be made from different types of material. In the case where the bonding material 14 and the sealing material 15 are made from different types of material, the bonding material 14 and the sealing material 15 may or may not be overlaid on each other. In the case where the bonding material 14 and the sealing material 15 are made from the same type of material, the process of bonding the lid 12 and the process of sealing the electronic element 10 can be carried out simultaneously. Additionally, the thermal expansion coefficient is the same on the top surface side and the bottom surface side, and thus deformation in the base body 2 can be reduced even in the case where the electronic element 10 operates and produces heat. Meanwhile, in the case where the bonding material 14 and the sealing material 15 are made from different types of material, the bonding material 14 and the sealing material 15 can be given different melting points. Thus, in the case where the process for sealing the electronic element 10 and the base body 2 is different from the process for bonding the lid 12 and the base body 2, situations where the bonding material 14 or the sealing material 15 melts at the reflow temperature and the electronic element 10 or the lid 12 shifts can be reduced.

Third Embodiment

The electronic element mounting substrate 1 and the electronic device 21 according to a third embodiment of the present invention will be described next with reference to FIGS. 10A to 11B. In the top views in FIGS. 10A and 11A, an area inside the lid 12 is indicated by a dashed line, and the grooves 4 are indicated by dotted lines.

The electronic device 21 according to the present embodiment differs from the electronic device 21 according to the second embodiment in terms of the shape of the groove 4 when viewed in plan view.

In the example illustrated in FIGS. 10A to 11B, the groove 4 has a shape in which, when viewed in plan view, the width is broader than that in FIGS. 8A to 9B. Specifically, when viewed in plan view, the length of the groove 4 in the width direction is greater than the length of the groove 4 in the depth direction. Here, the width direction of the groove 4 is, in the example illustrated in FIG. 10A, the direction following the edge of the opening 2c where the groove 4 is disposed (the y direction). The depth direction of the groove 4 is, in the example illustrated in FIG. 10A, the direction orthogonal to the edge of the opening 2c where the groove 4 is disposed (the x direction). According to this shape, the bonding material 14 or the sealing material 15 spreads out so as to move along the side surfaces of the groove 4. This makes it possible to provide a larger fillet in the bonding material 14 or the sealing material 15. With the large fillet, the force with which the bonding material 14 or the sealing material 15 pull and fix the lid 12 or the electronic element 10 can be increased. This makes it possible to improve the bonding strength of the lid 12 or the electronic element 10.

Meanwhile, because the bonding material 14 or the sealing material 15 spreads out and moves along the side surfaces of the groove 4, situations where the bonding material 14 or the sealing material 15 spread along the inner sides of the opening 2c when viewed in plan view can be reduced. Thus, in the case where the electronic device 21 is an imaging device, for example, image noise caused by the bonding material 14 or the sealing material 15 can be reduced. Note that a typical thermosetting resin or the like is used as the sealing material 15.

Fourth Embodiment

The electronic element mounting substrate 1 and the electronic device 21 according to a fourth embodiment of the present invention will be described next with reference to FIGS. 12A and 12B. Note that the lid 12 is not illustrated.

The electronic device 21 according to the present embodiment differs from the electronic device 21 according to the first embodiment in terms of the shape of the groove 4 when viewed as a cross-section. An inner wall of the groove 4 on the bottom surface side thereof is located further inward than an inner wall of the groove 4 on the top surface side thereof. In other words, an upper portion of the groove 4 is recessed more than a lower portion.

Figure 12A:
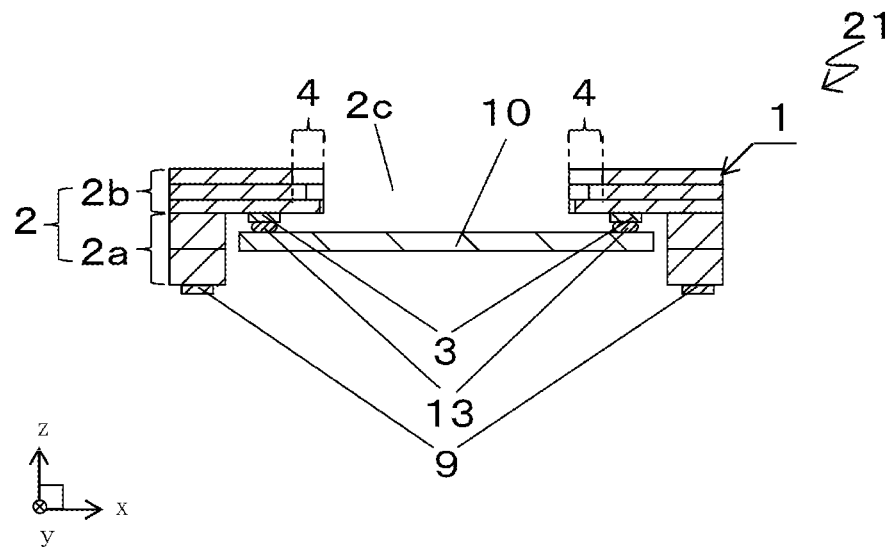
FIGS. 12A and 12B are vertical cross-sectional views illustrating the outer appearance of an electronic element mounting substrate and an electronic device according to an aspect of a fourth embodiment of the present invention.

In the example illustrated in FIG. 12A, the second frame section 2b is made from a plurality of electrically insulating layers, and in these electrically insulating layers, the inner wall of the groove 4 is located further inward in layers on the bottom surface side than in layers on the top surface side. As a result, the pads 3 can be positioned as close as possible to the opening 2c, and a sufficient volume can be disposed for the grooves 4. Accordingly, situations where stress concentrates at the area in the periphery of the opening 2c in the electronic element mounting substrate 1 that has deformed can be reduced, situations where cracks, fissures, and the like form in the electronic element mounting substrate 1 can be reduced, and the electronic device 21 can be made smaller.

The inner wall of the groove 4 in an intermediate layer of the second frame section 2b may be located further outward than the inner wall of the groove 4 in the uppermost layer and the lowermost layer. Doing so enables the bonding material 14 or the sealing material 15 to flow into the outward-located area in the intermediate layer of the second frame section 2b, which not only achieves the same effect as in FIG. 12A, but also makes it possible to ensure a bonding area between the lid 12 and the base body 2.

As a method for manufacturing the electronic element mounting substrate 1 in the example illustrated in FIG. 12A, assuming the base body 2 is made from an electrically insulating ceramic, when forming the grooves 4 in the ceramic green sheets that will form the electrically insulating layers, the inner walls of the grooves 4 in each of the electrically insulating layers are located further inward in the layers on the bottom surface side than in the layers on the top surface side. The substrate 2 can then be manufactured by pressurizing and layering the green sheets.

Figure 12B:
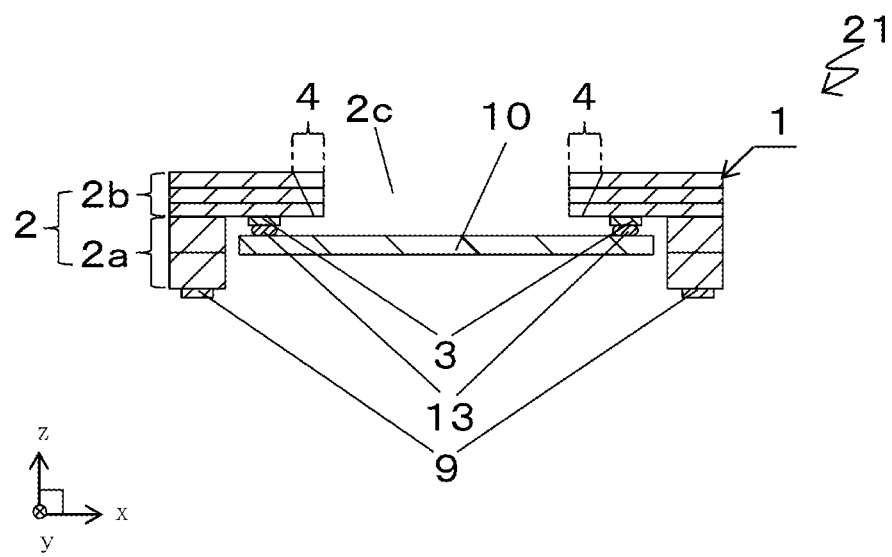

In the example illustrated in FIG. 12B, when viewed as a cross-section, the inner wall of the groove 4 is sloped so that the groove 4 is deeper in an upper portion than in a lower portion. Generally speaking, recent years have seen demand for the electronic element mounting substrate 1 to be thinner. This demand has led to the base body 2, or in other words the first frame section 2a and the second frame section 2b, becoming thinner as well, and the electrically insulating layers constituting the second frame section 2b have become extremely thin. Here, if the groove 4 is disposed as illustrated in FIG. 12A, deformations or the like may arise in the lowermost electrically insulating layer constituting the groove 4 of the second frame section 2b when mounting the electronic element 10 or handling the electronic element mounting substrate 1. Forming the groove 4 so that the inner wall thereof is sloped toward the bottom surface when viewed as a cross-section as in this configuration makes it possible to retain the effects of FIG. 12A while reducing the possibility of deformations or the like arising in the lowermost electrically insulating layer constituting the groove 4 of the second frame section 2b.

As a method for manufacturing the electronic element mounting substrate 1 in the example illustrated in FIG. 12B, assuming the base body 2 is made from an electrically insulating ceramic, the grooves 4 can be formed in the ceramic green sheets that will form the electrically insulating layers by punching out the grooves 4 using a metal mold. The electronic element mounting substrate 1 in the example illustrated in FIG. 12B can be manufactured by using, as the metal mold used at this time, a metal mold having sloped side surfaces, with the diameter of the concave metal mold being greater than the diameter of the convex metal mold.

Fifth Embodiment

The electronic element mounting substrate 1 and the electronic device 21 according to a fifth embodiment of the present invention will be described next with reference to FIGS. 13A and 13B. In the top views in FIGS. 13A and 13B, an area inside the lid 12 is indicated by a dashed line, and the grooves 4 are indicated by dotted lines.

The electronic device 21 according to the present embodiment differs from the electronic device 21 according to the second embodiment in terms of the locations where the grooves 4 are formed.

Figure 13A:
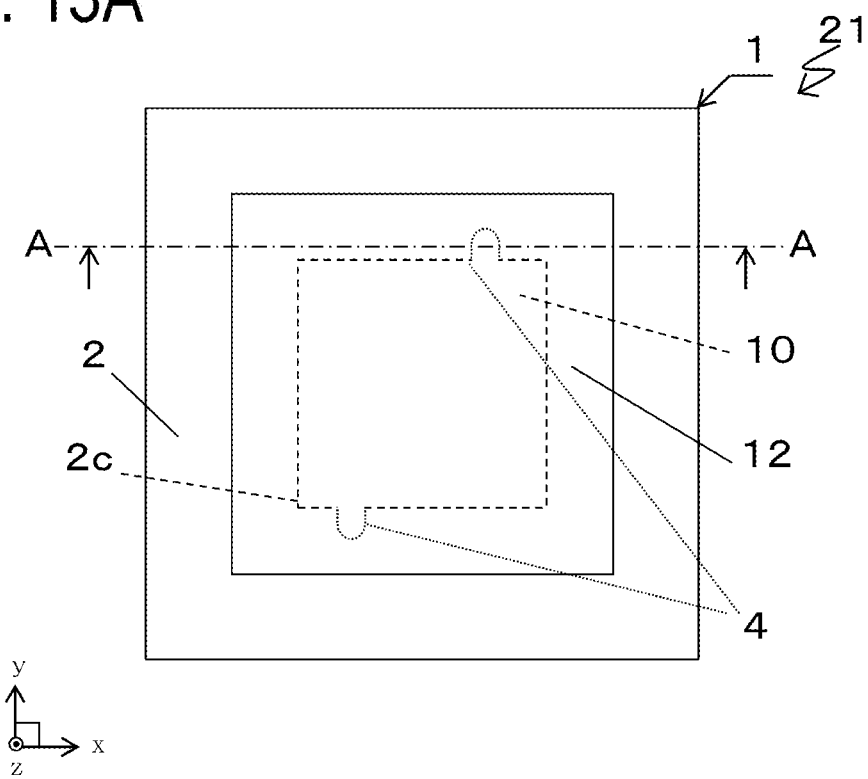
FIG. 13A is a top view illustrating the outer appearance of an electronic element mounting substrate and an electronic device according to a fifth embodiment of the present invention.
Figure 13B:
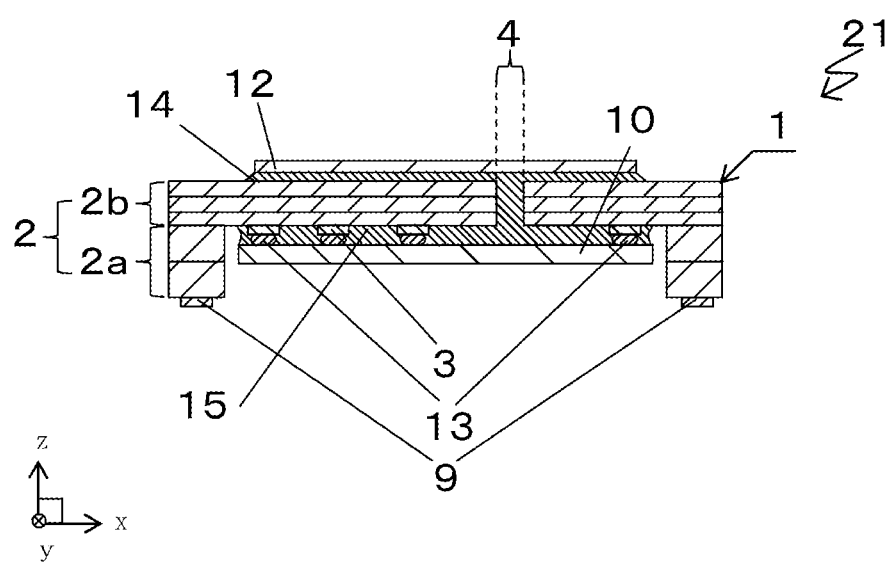
FIG. 13B is a vertical cross-sectional view corresponding to a line A-A in FIG. 13A.

In the example illustrated in FIGS. 13A and 13B, when viewed in a cross-section, the grooves 4 are formed in locations where there is a large degree of separation between the pads 3. There is a technique that fills the areas between the pads 3 with the sealing material 15 using a capillary phenomenon. When there is a large degree of separation between the pads 3 as in FIGS. 13A and 13B, the space may not be filled with the sealing material 15 properly. As such, providing the grooves 4 in locations where, when viewed in a cross-section, there is a large degree of separation between the pads 3, as in the present embodiment, makes it possible to suppress the formation of cracks, fissures, and the like in the opening 2c in the electronic element mounting substrate 1. The space between pads 3 that are greatly separated can be sufficiently sealed by the sealing material 15 rising along the grooves 4 and by the sealing material 15 flowing in from the top surface side.

The present invention is not intended to be limited to the examples described in the above-described embodiments, and many variations, such as to numerical values and the like, can be made thereon.

Further, for example, in the examples illustrated in FIGS. 1A to 13B, the shape of each of the pads 3, the electrodes 9, or the grooves 4 is a rectangular shape, but these may be a circular shape or another polygonal shape. The arrangement, numbers, shapes, and the like of the pads 3, the electrodes 9, and the grooves 4 in the aforementioned embodiments are not specified.

In addition, various combinations of characteristic portions of the above-described embodiments are not limited to the examples in the above-described embodiments.

REFERENCE SIGNS LIST

1 Electronic element mounting substrate
2 Base body
2a First frame section
2b Second frame section
2c Opening
3 Pad (electronic element connection pad)
4 Groove
9 Electrode (external circuit connection electrode)
10 Electronic element
12 Lid
13 Connecting member
14 Bonding material
15 Sealing material
21 Electronic device

The invention claimed is:

1. An electronic element mounting substrate comprising:
a base body, comprising a frame shape, comprising a first frame section and a second frame section, the second frame section being disposed on the first frame section and comprising an inner surface protruding further inward than an inner surface of the first frame section;
an electrode disposed on a bottom surface of the first frame section of the base body; and
a pad disposed on a bottom surface of a protruding part of the second frame section, the pad being electrically connected to the electrode,
wherein
a groove extending in a vertical direction is formed in an inner surface of the protruding part of the second frame section of the base body.

2. The electronic element mounting substrate according to claim 1, wherein the second frame section is rectangular, and the groove is disposed in both of sides facing each other.

3. The electronic element mounting substrate according to claim 2, wherein the second frame section is rectangular, and the groove is disposed in a corner portion where adjacent sides of the second frame section intersect.

4. The electronic element mounting substrate according to claim 3, wherein an upper part of the groove is recessed more than a lower part.

5. The electronic element mounting substrate according to claim 2, wherein a periphery of the groove in the second frame section is sloped upward or downward.

6. The electronic element mounting substrate according to claim 5, wherein an upper part of the groove is recessed more than a lower part.

7. The electronic element mounting substrate according to claim 2, wherein an upper part of the groove is recessed more than a lower part.

8. The electronic element mounting substrate according to claim 1, wherein the second frame section is rectangular, and the groove is disposed in a corner portion where adjacent sides of the second frame section intersect.

9. The electronic element mounting substrate according to claim 8, wherein an upper part of the groove is recessed more than a lower part.

10. The electronic element mounting substrate according to claim 1, wherein a periphery of the groove in the second frame section is sloped upward or downward.

11. The electronic element mounting substrate according to claim 10, wherein an upper part of the groove is recessed more than a lower part.

12. The electronic element mounting substrate according to claim 1, wherein an upper part of the groove is recessed more than a lower part.

13. An electronic device comprising:
the electronic element mounting substrate according to claim 1;
an electronic element connected to the pad and connected to a bottom surface of the second frame section; and
a lid disposed on a top surface of the second frame section.

* * * * *